(12) United States Patent
Schauer et al.

(10) Patent No.: US 10,509,698 B2
(45) Date of Patent: Dec. 17, 2019

(54) METHOD AND APPARATUS FOR DATA ENCODING AND DECODING USING A STANDARDIZED DATA STORAGE AND RETRIEVAL PROTOCOL

(71) Applicant: Goke US Research Laboratory, Santa Clara, CA (US)

(72) Inventors: Steven Schauer, Loveland, CO (US); Xinhai Kang, Milpitas, CA (US); Engling Yeo, San Jose, CA (US)

(73) Assignee: Goke US Research Laboratory, Santa Clara, CA (US)

( * ) Notice: Subject to any disclaimer, the term of this patent is extended or adjusted under 35 U.S.C. 154(b) by 0 days.

(21) Appl. No.: 15/973,373

(22) Filed: May 7, 2018

(65) Prior Publication Data

US 2019/0266048 A1 Aug. 29, 2019

Related U.S. Application Data

(63) Continuation-in-part of application No. 15/907,101, filed on Feb. 27, 2018.

(51) Int. Cl.
*G06F 11/10* (2006.01)
*G11C 29/52* (2006.01)
*G06F 13/42* (2006.01)
*G06F 13/16* (2006.01)

(52) U.S. Cl.
CPC ...... *G06F 11/1068* (2013.01); *G06F 13/1668* (2013.01); *G06F 13/4282* (2013.01); *G11C 29/52* (2013.01); *G06F 2213/0026* (2013.01)

(58) Field of Classification Search
CPC ...... G06F 21/72; G06F 13/4282; G06F 21/76; G06F 21/79; G06F 2213/0026; H04L 9/0897

See application file for complete search history.

(56) References Cited

U.S. PATENT DOCUMENTS

| | | | |
|---|---|---|---|
| 10,114,586 B1* | 10/2018 | Benisty | ............... G06F 3/0656 |
| 2014/0317219 A1 | 10/2014 | Fitch et al. | |
| 2015/0058529 A1 | 2/2015 | Lin et al. | |
| 2016/0094619 A1* | 3/2016 | Khan | ..................... H04L 67/10 |
| | | | 709/203 |

(Continued)

FOREIGN PATENT DOCUMENTS

WO WO 2016/186801 A1 11/2016

OTHER PUBLICATIONS

International Search Report, dated May 8, 2019, for corresponding International Application No. PCT/US2019/019682.

(Continued)

*Primary Examiner* — Idriss N Alrobaye
*Assistant Examiner* — Richard B Franklin
(74) *Attorney, Agent, or Firm* — Intellectual Property Law Group LLP (57) ABSTRACT

A system, method and apparatus for encoding and decoding data. A host processor and host memory are coupled to a block I/O device. The host processor issues encode and decode commands to the block I/O device in accordance with a high-speed data storage and retrieval protocol. The block I/O device encodes the data specified in the encode command, thus relieving the host processor of performing the encoding/decoding and freeing the host processor for other tasks.

17 Claims, 5 Drawing Sheets

(56) References Cited

U.S. PATENT DOCUMENTS

2018/0011812 A1   1/2018 Morishita et al.
2018/0173441 A1*  6/2018 Cargnini ............... G06F 3/0619
2018/0321987 A1* 11/2018 Benisty .................. G06F 9/528

OTHER PUBLICATIONS

Written Opinion of the International Searching Authority, dated May 8, 2019, for corresponding International Application No. PCT/US2019/019682.
International Search Report, dated Apr. 8, 2019, for corresponding International Application No. PCT/US2019/019685.
Written Opinion of the International Searching Authority, dated Apr. 8, 2019, for corresponding International Application No. PCT/US2019/019685.

* cited by examiner

METHOD AND APPARATUS FOR DATA ENCODING AND DECODING USING A STANDARDIZED DATA STORAGE AND RETRIEVAL PROTOCOL

REFERENCE TO RELATED APPLICATIONS

This application is a continuation-in-part of U.S. application Ser. No. 15/907,101, filed on Feb. 27, 2018, incorporated by reference in its entirety herein.

BACKGROUND

Field of Use

The present invention relates to the field of digital data storage and more specifically to data encoding to protect data against accidental loss.

Description of the Related Art

Commercial mass data storage has become a vital part of the modern economy. Thousands of companies rely on secure, fault-proof data storage to serve their customers.

Data storage in commercial settings typically provides for some form of data protection to guard against accidental data loss due to component and device failures, and man-made or natural disasters. The simplest form of protection is known as redundancy. Redundancy involves making multiple copies of the same data, and then storing the copies on a separate, physical drives. If a failure occurs on one drive, the data may be recovered simply by accessing it on another drive. This is obviously costly in terms of physical storage requirements.

More advanced recovery systems use a redundant array of independent disks (RAID). RAID systems typically utilize erasure encoding to mitigate accidental loss of data. Erasure encoding breaks blocks of data into n multiple, equal-sized segments and adds m parity segments. Thus, a RAID system stores n+m segments and is resilient against failures in up to any m segment failures.

Erasure encoding employing coding techniques such as Reed-Solomon codes requires substantial computational resources from a host CPU. Thus, encoding data prior to storage takes computational resources away from the host that could be used for other computations. The result is slower processing speed for other applications.

It would be desirable to provide redundancy in a data storage system without taking computational resources from a host CPU.

SUMMARY

The embodiments described herein relate to an apparatus, system and method for encoding and decoding data. In one embodiment, a block I/O device is described, comprising a controller configured to retrieve an encode command issued by a host processor, the controller coupled to the host processor and a host memory by a high-speed data bus, the encode command retrieved in accordance with a standardized data storage and retrieval protocol, to cause the data to be encoded in accordance with an encoding algorithm, and to provide a completion queue entry into a completion queue upon completion of the encoding, and a memory coupled to the controller for storing the encoding algorithm to encode the data.

In another embodiment, a computer system for encoding data is described, comprising a host processor for generating an encode command and storing the encode command into a submission queue, the encode command comprising a modified version of a command defined by a standardized data storage and retrieval protocol, a host memory for processor-executable instructions, a data bus, a block I/O device electronically coupled to the host processor and the host memory by the data bus, the block I/O device comprising, a controller configured to retrieve the encode command from a submission queue in accordance with the standardized data and retrieval protocol, to cause the data to be encoded in accordance with an encoding algorithm, and to provide a completion queue entry into a completion queue upon completion of the encoding, and a memory coupled to the controller for storing the encoding algorithm used to encode the data, and for storing the submission queue and the completion queue.

In another embodiment, a method for encoding data is described, comprising generating, by a host processor, an encode command, the encode command comprising a modified version of a Vendor Specific Command as defined by an NVMe data storage and retrieval protocol, storing, by the host processor, the encode command in a submission queue, retrieving, by a controller in an I/O block device coupled to the host processor by a data bus, the encode command from the submission queue in accordance with the NVMe data storage and retrieval protocol, retrieving, by the controller, data from an input buffer coupled to the controller at an input buffer address identified by the modified version of the Vendor Specific Command, encoding the block of data in accordance with the encoding command to generate encoded data, and storing, by the controller in a completion queue, a result of encoding the data.

BRIEF DESCRIPTION OF THE DRAWINGS

The features, advantages, and objects of the present invention will become more apparent from the detailed description as set forth below, when taken in conjunction with the drawings in which like referenced characters identify correspondingly throughout, and wherein.

DETAILED DESCRIPTION

Methods and apparatus are provided for encoding or decoding large amounts of data by a block I/O device coupled to a host processor and host memory via a high-speed data bus. The block I/O device performs encoding or decoding on data stored in an input buffer in accordance with commands issued by the host processor using a standardized data storage and retrieval protocol. This architecture enables the host processor to delegate burdensome encoding or decoding to the block I/O device, thus freeing up host processor resources for other tasks. This method is suitable for a scale-out architecture in which data may be encoded or decoded in parallel by a single block I/O device, or by multiple block I/O devices, each coupled to the host processor via the high-speed data bus.

Figure 1:
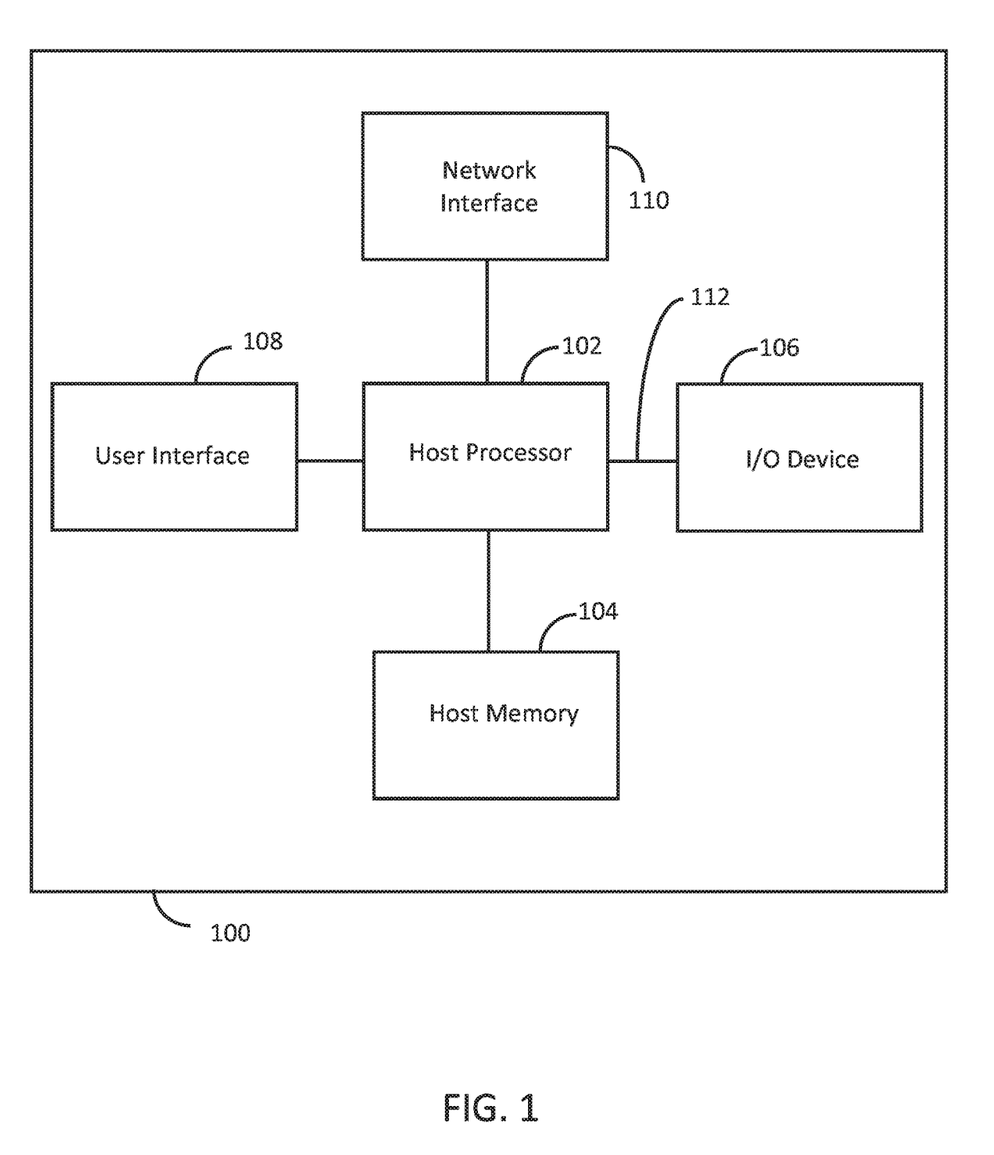
FIG. 1 illustrates a functional block diagram of one embodiment of a computer system utilizing the inventive concepts described herein.

FIG. 1 illustrates a functional block diagram of one embodiment of a computer system 100 using the inventive concepts described herein. Shown is computer system 100, comprising host processor 102, host memory 104, I/O device 106, user interface 108, and network interface 110. Host processor 102, host memory 104 and I/O device 106 are electronically coupled via data bus 112. I/O device typically comprises a connector that plugs into an expansion port on a motherboard of computer system 100.

Computer system 100 may comprise a personal computer or cloud-based server to perform a variety of tasks such as word processing, web browsing, email, web-hosting and mass data storage and retrieval Computer system 100 may comprise a server coupled to the Internet specifically configured to process data prior to storage and/or transmission, including data encoding and/or decoding. In some embodiments, block I/O device 106 may comprise a large-capacity SSD for storing large volumes (1 terabyte or more) of data. In other embodiments, block I/O device 106 may comprise one or more Static Random Access Memories (SRAM), or DDR memory partitioned in such a manner as to allow host processor 102 to define one or more memory areas as a scratchpad/temporary storage buffer(s). The term "block" refers to a peripheral device that processes and/or stores data in addressable, fixed-sized blocks. In other embodiments, block I/O device is a specialized encoding/decoding device (throughout this specification, it should be understood that the term "encoding" typically also refers to decoding). The specialized encoding/decoding device may be pre-configured with one or more encoding and/or decoding algorithms and related parameters. In some embodiments, an encoding algorithm index is used to associate a plurality of encoding algorithms each with a respective encoding algorithm index value (such as 1, 2, 3, 4 . . . ). In this way, host processor 102 may specify a particular encoding algorithm for block I/O device to use without providing the encoding algorithm itself to block I/O device 106.

Computer system 100 may be used to encode data destined for transmission to remote locations or decode encoded data received via network interface 110 from a wide-area data network, such as the Internet. In order to quickly encode or decode large volumes of data, host processor 102 offloads computationally-intensive encoding and decoding activities to block I/O device 106.

Processor 102 is configured to provide general operation of computer system 100 by executing processor-executable instructions stored in host memory 104, for example, executable computer code. Processor 102 typically comprises a general purpose microprocessor or microcontroller manufactured by Intel Corporation of Santa Clara, Calif. or Advanced Micro Devices of Sunnyvale, Calif., selected based on computational speed, cost and other factors.

Host memory 104 comprises one or more non-transitory information storage devices, such as RAM, ROM, EEPROM, UVPROM, flash memory, SD memory, XD memory, or other type of electronic, optical, or mechanical memory device. Host memory 104 is used to store processor-executable instructions for operation of computer system 100, as well as data destined for encoding, decoded data, an encoding algorithm index, one or more submission queues, one or more completion queues, and one or more administrative queues (such queues will be explained in more detail later herein). It should be understood that in some embodiments, a portion of host memory 104 may be embedded into processor 102 and, further, that host memory 104 excludes media for propagating signals.

Data bus 112 comprises a high-speed command and data interface between host processor 102 and peripheral devices such as block I/O device 106. In one embodiment, data bus 112 conforms to the well-known Peripheral Component Interconnect Express, or PCIe standard. PCIe is a high-speed serial computer expansion bus standard designed to replace older PCI, PCI-X, and AGP bus standards. Data bus 112 is configured to allow high-speed data transfer between host processor 102 and I/O device 106, such as data storage and retrieval, but may also transport configuration information, operational instructions and related parameters for processing by I/O device 106 as described in greater detail later herein. Data bus 112 may comprise a multi-strand data cable or be embedded into a motherboard of computer system 100.

Figure 2:
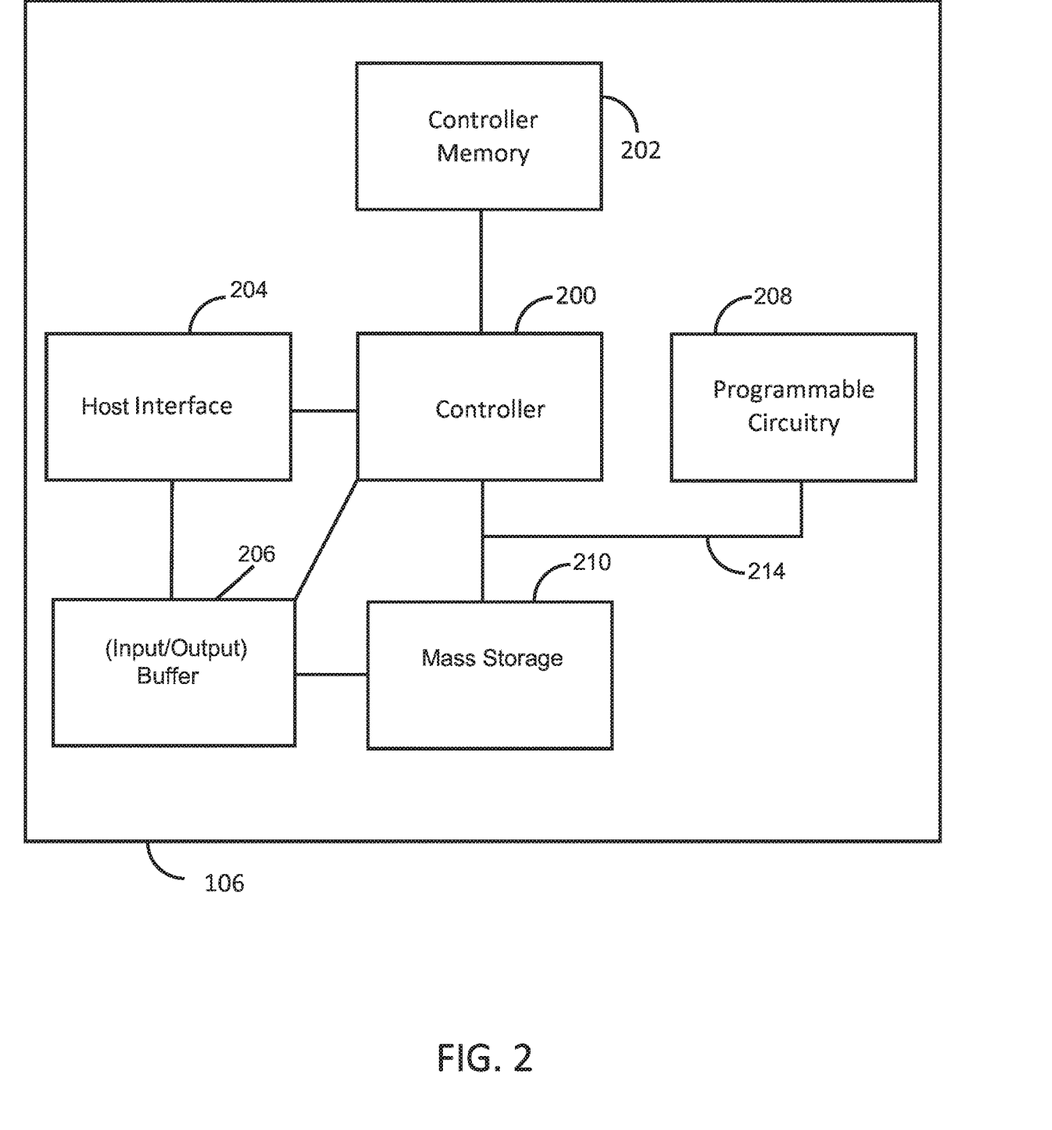
FIG. 2 is a functional block diagram of a block I/O device as shown in FIG. 1.

Block I/O device 106 comprises an internal or external peripheral device coupled to processor 102 and host memory 104 via data bus 112. As shown in FIG. 2, block I/O device 106 comprises a controller 200, a controller memory 202, and a host interface 204. In some embodiments, block I/O device additionally comprises buffer 206, programmable circuitry 208 and/or mass storage 210. Host processor 102 communicates with controller 200 via data bus 112 and host interface 204, which comprises circuitry well known in the art for providing a command and data interface between block I/O device 106 and data bus 112 (in other embodiments, host interface 204 is incorporated into controller 200). Block I/O device 106 may be configured to encode data arranged in "blocks", each sometimes referred to as a physical record, is a sequence of bytes or bits, usually containing some whole number of records, having a maximum length, a block size. In one embodiment, the well-known NVMe data storage and retrieval protocol is used to provide communications between block I/O device 106 and host processor 102 and host memory 104. The NVMe protocol defines both a register-level interface and a command protocol used by host processor 102 to communicate with NVMe-compliant devices. In one embodiment, block I/O device 106 is configured to be NVMe compliant.

In one embodiment, block I/O device 106 comprises a high-capacity SSD, such as a 1 Terabyte, 16-Channel ONFI-compliant NAND SSD with an 800 MBps NVMe interface. In this embodiment, block I/O device comprises a number of mass storage 210 devices in the form of a number of NAND flash memory chips, arranged in a series of banks and channels to store one or more terabytes of encoded data. In this embodiment, block I/O device 106 performs data storage and retrieval in accordance with the NVMe protocol, and also performs encoding prior to storage (and decoding upon data retrieval), in accordance with one or more modified Vendor Specific Commands defined under the NVMe protocol. Embodiments of the present invention define one or more commands to encode and decode blocks of data, based on the Vendor Specific Command, as described later herein.

Controller 200 comprises one or more custom ASICs, PGAs, and/or peripheral circuitry to perform the functionality of block I/O device 106. Such circuitry is well-known in the art.

Controller memory 202 comprises one or more non-transitory information storage devices, such as RAM, ROM, EEPROM, flash memory, SD memory, XD memory, or other type of electronic, optical, or mechanical memory device. Controller memory 202 is used to store processor-executable instructions for operation of controller 200, as well as one or more encoding algorithms in an encoding algorithm index.

In some embodiments, controller memory 202 is also used to store one or more submission queues, one or more completion queues, and/or one or more administrative queues. It should be understood that in some embodiments, controller memory 202 is incorporated into controller 200 and, further, that controller memory 202 excludes media for propagating signals.

Host interface 204 comprises circuitry and firmware to support a physical connection and logical emulation to host processor 102 and host memory 104, Such circuitry is well-known in the art.

Input/Output buffer 206 comprises one or more data storage devices for providing temporary storage for data awaiting encoding or decoding and/or data that has been encoded/decoded. Buffer 206 typically comprises RAM memory for fast access to the data. In one embodiment, buffer 206 comprises both an input buffer for temporary storage of un-encoded data prior to encoding and/or encoded data awaiting decoding, and an output buffer for temporary storage of encoded data after encoding or decoded data after decoding. The location acrd sizes of the buffers are determined in accordance with, in one embodiment, the NVMe protocol.

Programmable circuitry 208 comprises a programmable integrated circuit, such as an embedded FPGA, embedded video processor, a tensor processor, or the like, which typically comprises a large quantity of configurable logic gate arrays, one or more processors, I/O logic, and one or more memory devices. Programmable circuitry 208 offers configurability to implement one or more encoding algorithms, including both block and convolutional encoding techniques, such as various forms of well-known Hamming codes, low-density parity check (LDPC) codes, Turbo codes, Reed-Solomon codes, and others. Programmable circuitry 208 may be configured by host processor 102 via controller 200 over data bus 112, using a high-speed data protocol normally used to store and retrieve data with block I/O device 106. Programmable circuitry 208 may be coupled to controller 200 via bus 214, connected to the same data and control lines used by controller 200 to store and retrieve data in mass storage 210, in an embodiment that utilizes such mass storage, as programmable circuitry 208 typically comprises a number of bidirectional I/O data lines, a write enable and a read enable, among others. It should be understood that in other embodiments, programmable circuitry could be incorporated into controller 200. In these embodiments, programmable circuitry 208 may still utilize the same data and control lines used to store and retrieve data from mass storage 210.

Mass storage 210 comprises one or more non-transitory information storage devices, such as RAM memory, flash memory, SD memory, XD memory, or other type of electronic, optical, or mechanical memory device, used to store encoded and/or decoded data. In one embodiment, mass storage 210 comprises a number of NAND flash memory chips, arranged in a series of banks and channels to provide up to multiple terabytes of data. Mass storage 210 is electronically coupled to controller 200 via a number of data and control lines, shown as bus 214 in FIG. 2. For example, bus 214 may comprise a number of bidirectional I/O data lines, a write enable and a read enable, among others. Mass storage 210 excludes media for propagating signals.

Figure 3:
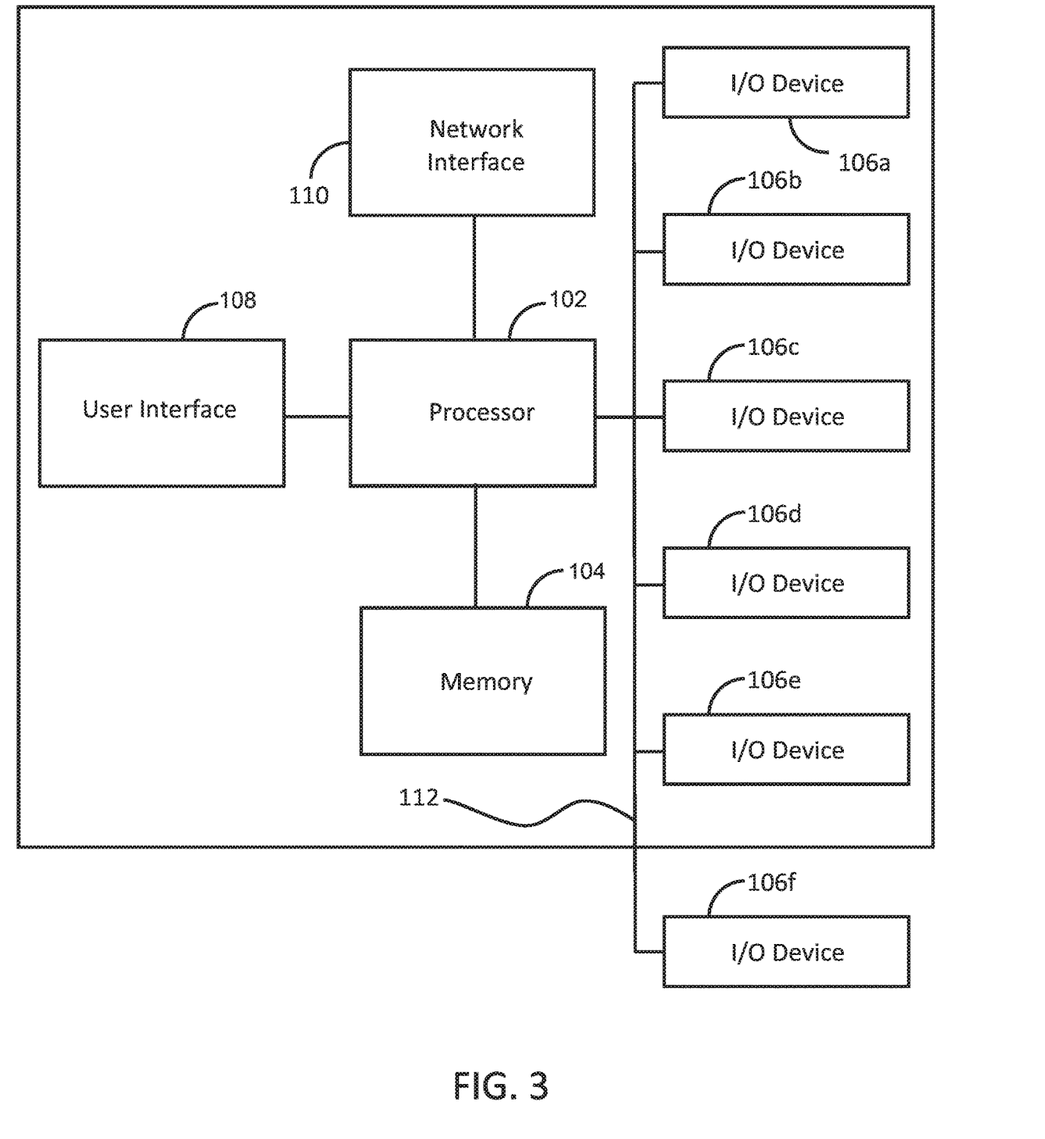
FIG. 3 is another embodiment of the computer system shown in FIG. 1 having multiple block I/O devices.

FIG. 3 is another embodiment of computer system 100, showing five internal block I/O devices 106a-106e, each mechanically coupled to a motherboard of computer system 100 (not shown) and electrically coupled to host processor 102 and host memory 104 via data bus 112. Additionally, block I/O device 106f is externally coupled to data bus 112 via a cable typically comprising a number of power, ground and signal wires and having a connector on each end that interfaces to the motherboard and an external connector on I/O device 106f (not shown). In this embodiment, one or more of the block I/O devices can encode data in accordance with commands from host processor 102. Host processor 102 may encode a large amount of data by assigning two or more of the block I/O devices to encode the data, either in parallel or serially. In one embodiment, after encoding, data is immediately stored in host memory 104, where in other embodiments where the block I/O devices comprise mass storage capabilities, the encoded data is stored by each block I/O device, respectively.

Figure 4A:
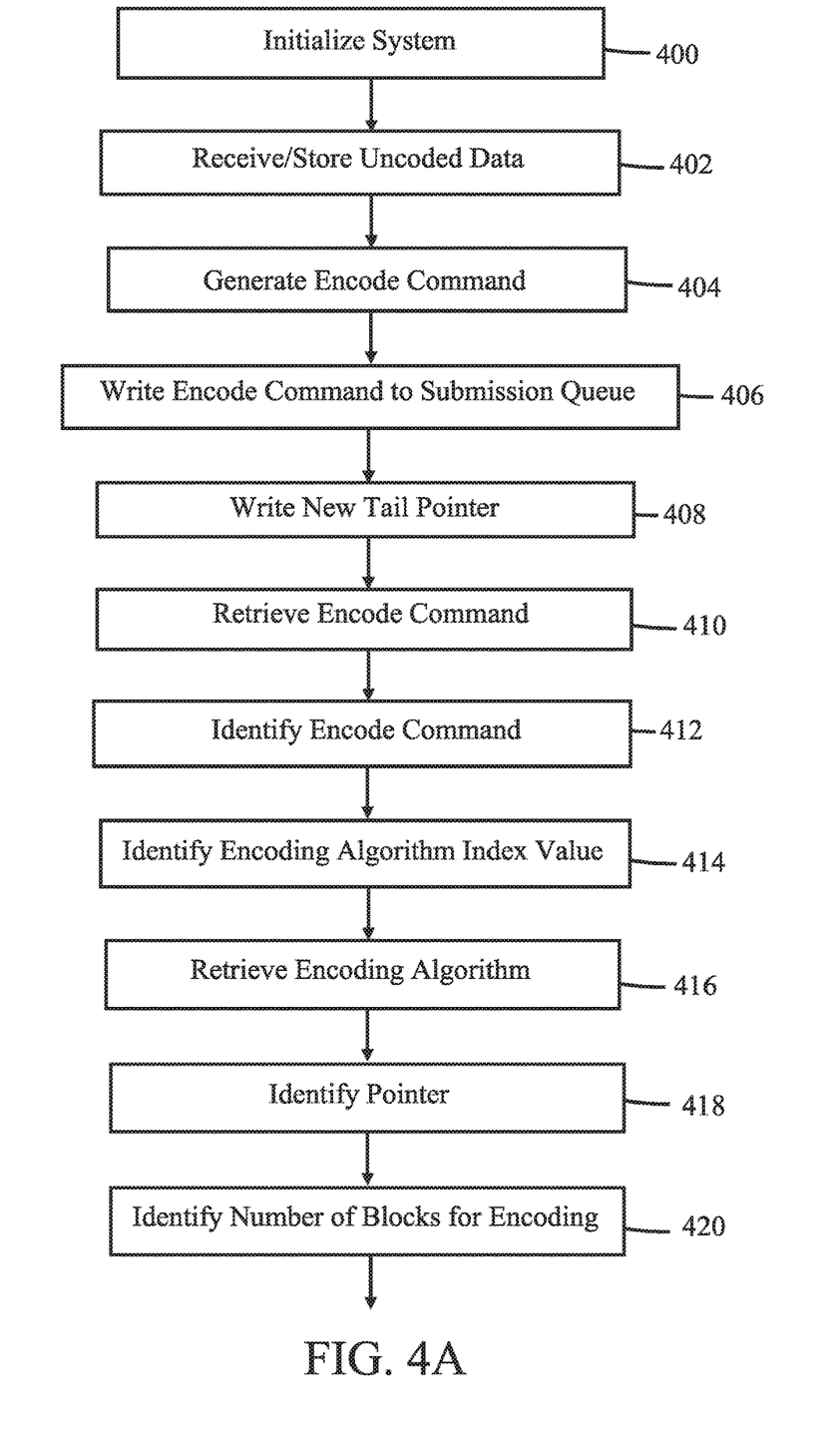
FIGS. 4A and 4B are flow diagrams illustrating one embodiment of a method performed by a host processor and an I/O device as shown in FIG. 1.
Figure 4B:
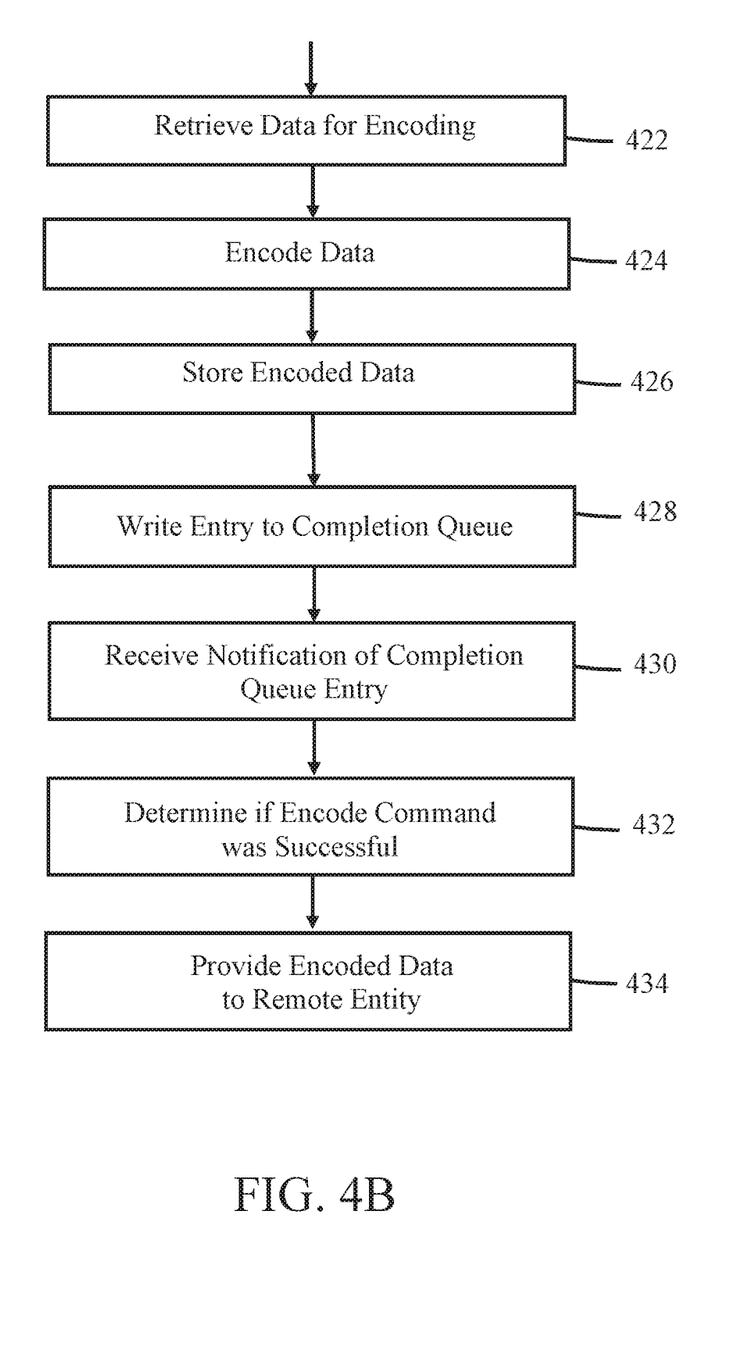

FIGS. 4A and 4B are flow diagrams illustrating one embodiment of a method performed by host processor 102 and I/O device 106 to encode or decode data. The method is implemented by host processor 102 and controller 200, executing processor-executable instructions stored in host memory 104 and controller memory 202, respectively. It should be understood that in some embodiments, not all of the steps shown in FIGS. 4A and 4B are performed and that the order in which the steps are carried out may be different in other embodiments. It should be further understood that some minor method steps have been omitted for purposes of clarity.

The method is described in reference to the well-known NVM Express protocol (NVMe) over a computer's PCIe bus, which allows host processor 102 to control block I/O device 106 to perform encoding and decoding and, in some embodiments, to store and retrieve encoded or decoded data.

NVMe is a storage interface specification for Solid State Drives (SSDs) on a PCIe bus. The latest version of the NVMe specification can be found at www.nvmexpress.org, presently version 1.3, dated May 1, 2017, and is incorporated by reference in its entirety herein. Encode and decode commands are provided in the form of modified Vendor Specific Commands, where a format for Vendor Specific Commands is defined by the NVMe protocol and shown below:

| Command Format - Admin and NVM Vendor Specific Commands | |
|---|---|
| Bytes | Description |
| 03:00 | Command Dword 0 (CDW0): This field is common to all commands and is defined in FIG. 10. |
| 07:04 | Namespace Identifier (NSID): This field indicates the namespace ID that this command applies to. If the namespace ID is not used for the command, then this field shall be cleared to 0h. Setting this value to FFFFFFFFh causes the command to be applied to all namespaces attached to this controller, unless otherwise specified. The behavior of a controller in response to an inactive namespace ID for a vendor specific command is vendor specific. Specifying an invalid namespace ID in a command that uses the namespace ID shall cause the controller to abort the command with status Invalid Namespace or Format, unless otherwise specified. |

Command Format - Admin and NVM Vendor Specific Commands

| Bytes | Description |
|---|---|
| 15:08 | Reserved |
| 39:16 | Refer to FIG. 11 for the definition of these fields. |
| 43:40 | Number of Dwords in Data Transfer (NDT): This field indicates the number of Dwords in the data transfer. |
| 47:44 | Number of Dwords in Metadata Transfer (NDM): This field indicates the number of Dwords in the metadata transfer. |
| 51:48 | Command Dword 12 (CDW12): This field is command specific Dword 12. |
| 55:52 | Command Dword 13 (CDW13): This field is command specific Dword 13. |
| 59:56 | Command Dword 14 (CDW14): This field is command specific Dword 14. |
| 63:60 | Command Dword 15 (CDW15): This field is command specific Dword 15. |

Both administrative and I/O Vendor Specific Commands may defined.

In one embodiment, a modified version of the Vendor Specific Command is defined to cause block I/O device to encode data, referred to as an encode command. The encode command (and, similarly, a decode command) is shown below:

| Bytes | Description |
|---|---|
| 03:00 | Command Dword 0 (CDW0): This field is common to all commands and is defined in FIG. 10. |
| 07:04 | Namespace Identifier (NSID): This field indicates a Namespace ID, used to identify an encoding/decoding algorithm index value. |
| 15:08 | Reserved |
| 39:16 | Refer to FIG. 11 for the definition of these fields. |
| 43:40 | Number of Dwords in Data Transfer (NDT): This field indicates the number of Dwords in a data transfer (i.e., amount of data to be encoded or decoded). |
| 47:44 | Number of Dwords in Metadata Transfer (NDM): This field indicates the number of Dwords in a metadata transfer. |
| 51:48 | Command Dword 12: Encode/Decode Data Pointer: This field specifies the address in memory where encoded/decoded data is to be transferred. ($1^{st}$ 4 bytes) |
| 55:52 | Command Dword 13: Encode/Decode Data Pointer: This field specifies the address in memory where encoded/decoded data is to be transferred. ($2^{nd}$ 4 bytes) |
| 59:56 | Command Dword 14: Encode/Decode Data Pointer: This field specifies the address in memory where encoded/decoded data is to be transferred. ($3^{rd}$ 4 bytes) |
| 63:60 | Command Dword 15: Encode/Decode Data Pointer: This field specifies the address in memory where encoded/decoded data is to be transferred. ($4^{th}$ 4 bytes) |

In one embodiment, each modified, Vendor Specific Command is 64 bytes long, comprising Command Dword 0, a Namespace Identifier field, a reserved field, a Metadata pointer, a Data pointer, a Number of Dwords in Data Transfer field, a Number of Dwords in Metadata Transfer field, and 4 command Dwords. It should be understood that in other embodiments, a different arrangement of the fields and the number of bits per field could be different than what is described in this embodiment. Each Dword, in this example, is four bytes.

A definition of this modified, Vendor Specific Command is stored in host memory 104 and in controller memory 202 for use by host processor 102 and controller 200, respectively.

At block 400, processor 102 and controller 200 cooperate with each other to determine a number of initial settings, such as to identify one or more encoding algorithms, formulate an encoding algorithm index associating the one or more encoding algorithms each with a respective encoding algorithm index value, to determine a number of submission queues, completion queues, and memory allocations, and/or to allocate physical memory to a number of Namespace IDs. One or more encoding algorithms keys may be identified as a one-time event, such as upon power-up of computer system 100 for the first time. The encoding algorithm(s) is/are stored in memory 202 and/or in memory 104, where each encoding algorithm is associated with a respective encoding algorithm index value (such as 1, 2, 3, 4).

A number of Submission queues and Completion queues (both Admin and I/O) may also be determined by processor 102 and/or controller 200, defining a number of each queue, a memory location for each queue and a size for each queue. The location of each queue may be defined by a particular physical memory (i.e., host memory 104, controller memory 202, and/or input/output buffer 206), and a memory address. Initialization of these queues is described in the NVMe specification, version 1.3.

Memory allocation may also be determined by processor 102 and controller 200. For example, an input buffer may be defined as part of buffer 206 located in block I/O device 106 for use by host processor 102 to temporarily store data destined for encoding or decoding. An output buffer may also be defined as a portion of buffer 206 used to temporarily store encoded or decoded data. Associated buffer sizes and memory addresses may also defined at this time. Such memory allocation is also described by the NVMe specification.

Memory allocation may additionally comprise defining a number of Namespace IDs, each Namespace ID identifying an area of physical memory (a "namespace"), used by processor 102 and controller 200 to logically separate and manage user data. The physical memory might comprise host memory 104, controller memory 202 and/or input/output buffer 206, or some other information storage device, or portion thereof, located remotely from computer system 100 and accessed via network interface 110.

At block 402, processor 102 receives data to be encoded, for example, a large text, image or video file from network interface 110 or from user interface 108. Processor 102 stores the data in host memory 104, or in input buffer 206, in one embodiment, as a number of logical blocks. In an embodiment where the data is stored in input buffer 206, the data may be transferred to input buffer 206 using one of a variety of data transfer protocols, such as PCIe. Host interface 204 may be used to aid in the transfer of data.

At block 404, processor 102 generates an encode command in accordance with the modified Vendor Specific Command, comprising, in this embodiment, 64 bytes. The encode command comprises Dword 0, representing an "operation code" or "op code", occupying bytes 0-3 of the encode command. In this embodiment, Dword 0 comprises 4 bytes with a value of A3 (hex), comprising a generic command field with a value of 1 (bit), a function field with a value of 010 00 (bits) and a data transfer field with a value of 11 (bit), similar to other opcodes as defined in FIG. 8 of the NVMe protocol. As an example, the following table summarizes an opcodes for encoding and decoding data:

| Opcode by Field | | | | | | |
|---|---|---|---|---|---|---|
| (07) Generic Command | (06:02) Function | (01:00) Data Transfer | Combined Opcode | Optional/ Mandatory | Namespace Identifier Used | Command |
| 1b | 010 00b | 11b | A3h | M | No | Encode Data |
| 1b | 010 001 | 11b | A7h | M | No | Decode Data |

The encode command additionally comprises a Namespace Identification field or Namespace ID field. In one embodiment, this field is 4 bytes long, occupying bytes 4-7 in the encode command. The Namespace ID field is used to identify a quantity of non-volatile memory that may be formatted into logical blocks. For example, sixteen Namespace IDs can be defined, each assigned by controller 200 for use by a particular user. Controller 200 additionally associates each Namespace ID with a portion of a physical memory. In this way, users may only access one portion of the hard drive that has been allocated to each of them. Then, as requests to encode and decode data are received by processor 102, processor 102 formulates either an encode/ decode command, inserting a Namespace ID into the Namespace ID field in association with the user who submitted a request.

In one embodiment, the Namespace ID is additionally used to identity an encoding algorithm index value, representing a particular encoding algorithm for use in encoding data. Two or more encoding algorithm index values, along with their respective encoding algorithms, are stored in association as an encoding algorithm index that may be pre-stored in host memory 104 and/or in controller memory 202. Each encoding algorithm index value is associated with a particular encoding algorithm used in connection with an encoding algorithm that is executed by block I/O device 106. In operation, processor 102 determines a Namespace ID associated with data to be encoded and inserts that Namespace ID into the Namespace ID field of the encode/ decode command, representing an encoding algorithm index value for encoding/decoding. Block I/O device 106 then encodes or decodes data using an encoding algorithm associated with the encoding algorithm index value.

Bytes 8-15 of the encode command are reserved for future uses by the NVMe protocol, so processor 102 does not typically assign any value to these bytes.

Bytes 16-23 of the encode command are used as a pointer to metadata that may be associated with the data stored in host memory 104. Processor 102 does not typically assign any value to these bytes.

Bytes 24-39 of the encode command are used as a pointer to the data in host memory 104 or input/output buffer 206 targeted for encoding/decoding by the encode/decode command.

Bytes 40-43 indicate a number of Dwords (amount of data) stored in host memory 104 or input/output buffer 206 destined for encoding/decoding by the encode/decode command.

Bytes 44-47 indicate a number of Dwords in a transfer of metadata from host memory 104 to block I/O device. However, in one embodiment, metadata is typically not used in the data encoding process.

Bytes 48-63 comprises Dwords 12-15, each Dword 4 bytes long. Dwords 12-15 are combined to form a sixteen-byte address in host memory 104 or input/output buffer 206 where encoded/decoded data should be stored.

At block 406, host processor 102 writes the encode command to a submission queue stored by host memory 104 or memory 202. The submission queue is a circular buffer with a fixed slot size that host processor 102 uses to submit commands for execution by controller 200. NVMe is based on a paired Submission and Completion Queue mechanism. Commands are placed by host processor 102 into a Submission Queue and completions by controller 200 are placed into an associated Completion Queue. Multiple Submission Queues may utilize the same Completion Queue. Submission and Completion Queues are allocated by host processor 102 and controller 200 in host memory 104 and/or in controller memory 202, as described earlier herein. An Admin Submission Queue (and associated Completion Queue) may exist for purposes of management and control (e.g., creation and deletion of I/O Submission and Completion Queues, aborting commands, etc.).

At block 408, in response to writing the encode command to the submission queue, host processor 102 writes a new tail pointer to a hardware doorbell register associated with the submission queue that alerts controller 200 that a command is available for execution in the submission queue.

At block 410, controller 200 retrieves the encode command from the submission queue over data bus 112 in accordance with the NVMe protocol.

At block 412, controller 200 identifies and validates the encode command as a command to encode data by comparing the opcode in bytes 0-3 to a list of opcodes stored in controller memory 202.

At block 414, controller 200 identifies and validates an encoding algorithm index value as the Namespace ID stored in the Namespace ID field (i.e., bytes 4-7 of the encode command).

At block 416, in response to identifying the encoding algorithm index value, controller 200 retrieves an encoding algorithm associated with the encoding algorithm index value from an encoding algorithm index stored in controller memory 202.

At block 418, controller 200 identifies a pointer in the encode command (i.e., bytes 24-39), pointing to a starting address in host memory 104 or input/output buffer 206 of an amount of data to be encoded or decoded. In one embodiment, the amount of data to be encoded or decoded comprises a number of blocks of data.

At block 420, controller 200 identifies a number of Dwords stored in host memory 104 or input/output buffer 206 to be encoded/decoded.

At block 422, controller 200 retrieves the amount of data from host memory 104 or input/output buffer 206, starting at the address provided by the pointer. Host interface 204 may be used to aid in the transfer of data, and the data may be stored temporarily in input/output buffer 206.

At block 424, controller 200 encodes the data that was retrieved at block 420, using the encoding algorithm that was retrieved at block 416. In one embodiment, controller 200 performs the encoding using an encoding algorithm stored in controller memory 202. In another embodiment, programmable circuitry 208 performs encoding/decoding. In this embodiment, programmable circuitry 208 is programmed by host processor 102 over data bus 112 using an Admin Vendor Specific Command.

The Admin Vendor Specific Command is an administrative command that utilizes the format of the Vendor Specific Command described by FIG. 12 in the NVMe specification. In the case where programmable circuitry 208 comprises an FPGA, host processor 102 provides configuration information to controller 200 for controller 200 to manipulate internal link sets of the FPGA in order to execute the encoding algorithm. As an example, the following table defines two opcodes used to identify custom Admin Vendor Specific Commands to configure programmable circuitry 208 to execute a given encoding algorithm:

| Opcode by Field | | | | | | |
|---|---|---|---|---|---|---|
| (07) Generic Command | (06:02) Function | (01:00) Data Transfer | Combined Opcode | Optional/ Mandatory | Namespace Identifier Used | Command |
| 1b | 001 00b | 00b | 90h | M | No | Encoding Algorithm Download |
| 1b | 001 01 | 00 | 94h | M | No | Encoding Algorithm Commit |

In this example, an Encoding Algorithm Download command of 90h is defined to instruct controller 200 to retrieve instructions from host memory 104 for configuring programmable circuitry 208 to perform a particular encoding algorithm, and the Encoding Algorithm Commit command of 94h causes controller 200 to activate the particular encoding algorithm. The instructions to configure programmable circuitry 208 are retrieved by controller 200 over data bus 112 in accordance with the NVMe data storage and retrieval protocol. Controller 200 then configures programmable circuitry with the instructions that cause programmable circuitry 208 to execute the particular encoding algorithm identified by the Admin Encoding Algorithm Download command.

At block 426, after the data has been encoded, controller 200 stores the encoded data in host memory 104 or in input/output buffer 206, beginning at an address specified in the encode command, i.e., Dwords 12-15 at bytes 48-63 in the encode command. In another embodiment, controller 200 stores the encoded data in mass storage 210 for later retrieval by host processor 102.

At block 428, controller 200 writes a completion queue entry into a Completion Queue typically stored in host memory 104, indicating successful or unsuccessful completion of the encode/decode command and/or generates an completion interrupt, to host processor 102. The NVMe specification defines a Completion Queue as a circular buffer with a fixed slot size used to post status for completed commands. A Completion Queue Head pointer is updated by host processor 102 after it has processed Completion Queue entries indicating a last free Completion Queue slot. A Phase Tag (P) bit is defined in the completion queue entry to indicate whether an entry has been newly posted without consulting a register. This enables host processor 102 to determine whether the new entry was posted as part of a previous or current round of completion notifications. Specifically, controller 200 inverts the Phase Tab bit each time that a round of updates through the Completion Queue entries is completed.

At block 430, host processor 102 receives notification of the presence of an entry into the Completion Queue in accordance with the NVMe protocol.

At block 432, host processor 102 determines if the encode command was successful or not by evaluating the completion queue entry. Processor 102 may encode or decode large amounts of data by providing additional encode/decode commands to block I/O device 106 in parallel, using up to 64 k Submission Queues and up to 64 k completion queues. Each queue is capable of storing up to 64 k commands. Thus, a large volume of data may be encoded/decoded without consuming excessive host processor resources.

At block 434, host processor 102 may provide the encoded/decoded data from host memory 104 or input/ output buffer 206 as identified by a memory address defined by Dwords 12-15 of the encode/decode command, to a remote location over network interface 110 via a wide-area network.

The methods or algorithms described in connection with the embodiments disclosed herein may be embodied directly in hardware or embodied in processor-readable instructions executed by a processor. The processor-readable instructions may reside in RAM memory, flash memory, ROM memory, EPROM memory, EEPROM memory, registers, hard disk, a removable disk, a CD-ROM, or any other form of storage medium known in the art. An exemplary storage medium is coupled to the processor such that the processor can read information from, and write information to, the storage medium. In the alternative, the storage medium may be integral to the processor. The processor and the storage medium may reside in an ASIC. The ASIC may reside in a user terminal. In the alternative, the processor and the storage medium may reside as discrete components.

Accordingly, an embodiment of the invention may comprise a computer-readable media embodying code or processor-readable instructions to implement the teachings, methods, processes, algorithms, steps and/or functions disclosed herein.

It is to be understood that the decoding apparatus and methods described herein may also be used in other communication situations and are not limited to RAID storage. For example, compact disk technology also uses erasure and error-correcting codes to handle the problem of scratched disks and would benefit from the use of the techniques described herein. As another example, satellite systems may use erasure codes in order to trade off power requirements for transmission, purposefully allowing for more errors by reducing power and chain reaction coding would be useful in that application. Also, erasure codes may be used in wired and wireless communication networks, such as mobile telephone/data networks, local-area networks, or the Internet. Embodiments of the current invention may, therefore, prove useful in other applications such as the above examples, where codes are used to handle the problems of potentially lossy or erroneous data.

While the foregoing disclosure shows illustrative embodiments of the invention, it should be noted that various changes and modifications could be made herein without departing from the scope of the invention as defined by the appended claims. The functions, steps and/or actions of the method claims in accordance with the embodiments of the invention described herein need not be performed in any particular order. Furthermore, although elements of the invention may be described or claimed in the singular, the plural is contemplated unless limitation to the singular is explicitly stated.

We claim:

1. A block I/O device, configured to encode data, comprising:
   a controller configured to retrieve an encode command issued by a host processor, the controller coupled to the host processor and a host memory by a high-speed data bus, the encode command retrieved in accordance with a standardized data storage and retrieval protocol, to cause the data to be encoded in accordance with an encoding algorithm, and to provide a completion queue entry into a completion queue upon completion of the encoding; and
   a memory coupled to the controller for storing the encoding algorithm to encode the data;
   wherein the memory further stores an encoding algorithm index, the encoding algorithm index for associating one or more encoding algorithms stored in the memory with one or more encoding algorithm index values, respectively, wherein the controller is configured to cause the data to be encoded using a first encoding algorithm identified in the encoding algorithm index in accordance with a first encoding algorithm index value specified by the encode command.

2. The block I/O device of claim 1, wherein the data bus comprises a PCIe bus, and the standardized data storage and retrieval protocol comprises an NVMe protocol.

3. The block I/O device of claim 1, further comprising:
   an input buffer coupled to the controller;
   wherein the controller is configured to cause the data to be encoded by retrieving one or more blocks of the data from the input buffer at an address in the input buffer specified by the encode command.

4. The block I/O device of claim 1, further comprising:
   an output buffer coupled to the controller;
   wherein the controller is configured to store the encoded data in the output buffer beginning at an address in the output buffer specified by the encode command.

5. The block I/O device of claim 1, wherein the data bus comprises a PCIe bus, and the standardized data storage and retrieval protocol comprises an NVMe protocol, wherein the first encoding algorithm index value is provided by the host processor in a Namespace ID field of a Vendor Specific Command.

6. The block I/O device of claim 1, further comprising:
   programmable circuitry for encoding the data in accordance with the encoding algorithm, the programmable circuitry programmed by the controller in response to the controller retrieving an administrative command from an administrative submission queue in accordance with the data storage and retrieval protocol.

7. The block I/O device of claim 6, wherein the programmable circuitry comprises an embedded FPGA.

8. A computer system for encoding data, comprising:
   a host processor for generating an encode command and storing the encode command into a submission queue, the encode command comprising a modified version of a command defined by a standardized data storage and retrieval protocol;
   a host memory for processor-executable instructions;
   a data bus;
   a block I/O device electronically coupled to the host processor and the host memory by the data bus, the block I/O device comprising;
   a controller configured to retrieve the encode command from the submission queue in accordance with the standardized data and retrieval protocol, to cause the data to be encoded in accordance with an encoding algorithm, and to provide a completion queue entry into a completion queue upon completion of the encoding; and
   a memory coupled to the controller for storing the encoding algorithm used to encode the data, and for storing the submission queue and the completion queue;
   wherein the memory further stores an encoding algorithm index, the encoding algorithm index for associating one or more encoding algorithms stored in the memory with one or more encoding algorithm index values, respectively, wherein the controller is configured to cause the data to be encoded using a first encoding algorithm in the encoding algorithm index in accordance with a first encoding algorithm index value specified by the encode command.

9. The computer system of claim 8, wherein the data bus comprises a PCIe bus, and the standardized data storage and retrieval protocol comprises an NVMe protocol.

10. The computer system of claim 8, wherein the block I/O device further comprises:
    an input buffer coupled to the controller;
    wherein the controller is configured to cause the data to be encoded by retrieving one or more blocks of the data from the input buffer at an address in the input buffer specified by the encode command.

11. The computer system of claim 8, wherein the block I/O device further comprises:
    an output buffer coupled to the controller;
    wherein the controller is configured to store encoded data in the output buffer at an address in the output buffer specified by the encode command.

12. The computer system of claim 8, wherein the block I/O device further comprises:

programmable circuitry coupled to the controller for encoding the data in accordance with the encoding algorithm, the programmable circuitry programmed by the controller in response to the controller retrieving a second command from an administrative submission queue in accordance with the data storage and retrieval protocol.

13. The computer system of claim 12, wherein the programmable circuitry comprises an embedded FPGA.

14. A method for encoding data, performed by a block I/O control device, comprising:
   generating, by a host processor, an encode command, the encode command comprising a modified version of a Vendor Specific Command as defined by an NVMe data storage and retrieval protocol;
   storing, by the host processor, the encode command in a submission queue;
   retrieving, by a controller in an I/O block device coupled to the host processor by a data bus, the encode command from the submission queue in accordance with the NVMe data storage and retrieval protocol;
   retrieving, by the controller, data from an input buffer coupled to the controller at an input buffer address identified by the modified version of the Vendor Specific Command;
   encoding a block of data in accordance with the encode command to generate encoded data, wherein encoding the data comprises:
      retrieving an encoding algorithm index value from the encode command;
      retrieving a first encoding algorithm from a memory coupled to the controller associated with the encoding algorithm index value; and
      encoding the block of data using the first encoding algorithm; and
   storing, by the controller in a completion queue, a result of encoding the data.

15. The method of claim 14, wherein encoding the data further comprises:
   storing, by the controller, the encoded data to an output buffer coupled to the controller at an address in the output buffer specified by the encode command.

16. The method of claim 14, wherein the encoding algorithm index value is retrieved from a Namespace ID field defined by the Vendor Specific Command as a field that identifies an area in a memory used to store data.

17. The method of claim 14, wherein encoding the data comprises providing the data to programmable circuitry in the block I/O device, the programmable circuitry programmed by the controller in response to the controller retrieving an administrative command from an administrative submission queue stored in accordance with the NVMe data storage and retrieval protocol.

* * * * *